(12) United States Patent
Sizov et al.

(10) Patent No.: US 8,897,329 B2
(45) Date of Patent: Nov. 25, 2014

(54) GROUP III NITRIDE-BASED GREEN-LASER DIODES AND WAVEGUIDE STRUCTURES THEREOF

(75) Inventors: Dmitry Sizov, Corning, NY (US); Rajaram Bhat, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 406 days.

(21) Appl. No.: 12/885,951

(22) Filed: Sep. 20, 2010

(65) Prior Publication Data

US 2012/0069863 A1    Mar. 22, 2012

(51) Int. Cl.
| | |
|---|---|
| *H01S 5/00* | (2006.01) |
| *B82Y 20/00* | (2011.01) |
| *H01S 5/343* | (2006.01) |
| *H01S 5/32* | (2006.01) |
| *H01S 5/20* | (2006.01) |

(52) U.S. Cl.
CPC ........... *H01S 5/34333* (2013.01); *H01S 5/3211* (2013.01); *H01S 5/2031* (2013.01); *B82Y 20/00* (2013.01); *H01S 5/2018* (2013.01)
USPC .................................. 372/45.01; 372/45.012

(58) Field of Classification Search
USPC ........................................ 372/45.01, 45.012
See application file for complete search history.

(56) References Cited

U.S. PATENT DOCUMENTS

| | | | | |
|---|---|---|---|---|
| 5,048,038 | A * | 9/1991 | Brennan et al. .......... | 372/46.015 |
| 5,751,752 | A * | 5/1998 | Shakuda .................... | 372/45.01 |
| 6,724,013 | B2 | 4/2004 | Kneissl et al. ................... | 257/79 |
| 2004/0051107 | A1 | 3/2004 | Nagahama et al. ............. | 257/79 |
| 2006/0018353 | A1 * | 1/2006 | Hata et al. ................... | 372/46.01 |
| 2006/0126688 | A1 * | 6/2006 | Kneissl ......................... | 372/43.01 |
| 2007/0002914 | A1 * | 1/2007 | Ryu et al. .................... | 372/45.01 |
| 2007/0133650 | A1 * | 6/2007 | Kim et al. ...................... | 372/102 |
| 2008/0008220 | A1 | 1/2008 | Ueda et al. ............... | 372/45.011 |
| 2008/0095492 | A1 | 4/2008 | Son et al. ......................... | 385/14 |
| 2008/0175293 | A1 | 7/2008 | Tanaka ........................ | 372/45.01 |
| 2009/0180505 | A1 * | 7/2009 | Kohda et al. ................ | 372/43.01 |
| 2010/0142577 | A1 * | 6/2010 | Tsuda et al. ................ | 372/45.01 |
| 2010/0189148 | A1 * | 7/2010 | Kyono et al. ................ | 372/45.01 |

FOREIGN PATENT DOCUMENTS

JP    2009246005    10/2009

OTHER PUBLICATIONS

C.Y. Huang, et al., "Optical waveguide simulations for the optimization of InGaN-based green laser diodes," *Journal of Applied Physics*, Jan. 22, 2010, vol. 107, p. 023101.

E. Kioupakis, et al., "Free-carrier absorption in nitrides from first principles," *Physical Review B*, vol. 81, Jun. 2, 2010, p. 241201(R).

(Continued)

*Primary Examiner* — Tod T Van Roy
(74) *Attorney, Agent, or Firm* — Gregory V. Bean (57) ABSTRACT

Group III nitride-based laser diodes comprise an n-side cladding layer formed of n-doped (Al,In)GaN, an n-side waveguide layer formed of n-doped (Al)InGaN, an active region, a p-side waveguide layer formed of p-doped (Al)InGaN, and a p-side cladding layer formed of p-doped (Al,In)GaN. Optical mode is shifted away from high acceptor concentrations in p-type layers through manipulation of indium concentration and thickness of the n-side waveguide layer. Dopant and compositional profiles of the p-side cladding layer and the p-side waveguide layer are tailored to reduce optical loss and increased wall plug efficiency.

24 Claims, 2 Drawing Sheets

(56) References Cited

OTHER PUBLICATIONS

J.P. Loehr, et al., "Effect of coherent strain on hydrogenic acceptor levels in InyGa1-yAs quantum well structures," *Appl. Phys. Lett.*, Jul. 9, 1990, vol. 57, No. 2.

U.Shiro, et al., "Recent progress in high-power blue-violet lasers; IEEE Journal of selected topics in quantum electronics," 2003, vol. 9, pp. 1252-1259.

A. Tyagi, et al., "AlGaN-cladding free green semipolar GaN based laser diode with a lasing wavelength of 506.4 nm," *Appl. Phys. Express*, 2010, vol. 3, p. 011002.

K. Kohler, et al., "Control of the Mg doping profile in III-N light-emitting diodes and its effect on the electroluminescence efficiency," *J. Appl. Phys.*, 2005, vol. 97, p. 104914.

T.E. Slobodyan, et al., "Optical Confinement in Laser Diodes Based on Nitrides of Group III Elements. Part 2: Analysis of Heterostructures on Various Substrates," *Semiconductors*, vol. 42, No. 7, 2008, pp. 871-877.

Sharma T et al: Application-oriented nitride substrates: The key to long-wavelength nitride lasers beyond 500 nm:, Journal of Applied Physics, American Insittute of Physics. New York, US, vol. 107, No. 2, Jan. 27, 2010, pp. 24516-24516, XP012133253, ISSN: 0021-8979, DOI: 10.1063/1.3280033 paragraphs [00IV], [0VII].

Ohta H et al: "Nonpolar/semipolar GaN technology for violet, blue, and green laser diodes", MRS Bulletin, Materials Research Society, US, vol. 34, No. 5, May 1, 2009 pp. 324-327, XP009142548, ISSN: 0883-7694 the whole document.

Richard Stevenson, IEEE Inc. New York, US, vol. 47, No. 3, Mar. 1, 2010 pp. 34-39, XP011290127 ISSN: 0018-9235, DOI: 10.1109/MSPEC.2010.5421899 the whole document.

D P Bour et al: "design and performance of Asymmetric waveguide Nitride laser diodes" IEEE Journal of Quantum Elctronics, vol. 36, No. 2, Feb. 1, 2000, pp. 184-191, XP002679472, the whole document.

M Cooke: "getting a green light from lasers", Semiconductor Today, vol. 4 No. 8, Oct. 1, 2009, pp. 62-66, XP002679473, the whole document.

\* cited by examiner

GROUP III NITRIDE-BASED GREEN-LASER DIODES AND WAVEGUIDE STRUCTURES THEREOF

TECHNICAL FIELD

The present disclosure relates to semiconductor lasers and, more specifically, to green-emitting Group III nitride-based laser diodes and waveguide structures thereof.

BACKGROUND

A combination of high optical confinement and low internal optical loss is desired in laser diodes to achieve a high wall plug efficiency (WPE). Wall-plug efficiency is a common figure of merit defined as the ratio of the optical power output from the laser diode to the electrical power input into the laser diode. Optical power output may be diminished, for example, by internal optical losses, such as by absorption of photons by device layers or by current carriers within the device layers. High WPE may be achieved from structures having both low internal optical loss and high output optical loss. But high output optical loss requires high optical gain. If optical material gain is inherently limited by a chosen material, a large optical confinement factor is required to increase optical gain.

There remain ongoing needs for green-laser diode configurations that result in low internal optical loss, high optical gain, low series resistance, and reduced occurrence of misfit defects near the active region. In particular, there remain ongoing needs to determine optimal materials, layer structures, and dopant profiling within the layer structures so as to increase wall plug efficiencies.

SUMMARY

Group III nitride-based laser diodes according to embodiments described herein may comprise an n-side cladding layer formed of n-doped (Al,In)GaN, an n-side waveguide layer formed of n-doped (Al)InGaN, an active region, a p-side waveguide layer formed of p-doped (Al)InGaN, and a p-side cladding layer formed of p-doped (Al,In)GaN.

The active region is interposed between the n-side cladding layer and the p-side cladding layer and extends substantially parallel to the n-side cladding layer and the p-side cladding layer. The active region comprises one or more InGaN quantum wells configured for electrically-pumped stimulated emission of photons such that the active region produces optical gain at a lasing wavelength from 510 nm to 580 nm. The n-side waveguide layer is interposed between the active region and the n-side cladding layer. The n-side waveguide layer has an n-side waveguide layer thickness from 1 nm to 300 nm. The p-side waveguide layer is interposed between the active region and the p-side cladding layer.

The p-side waveguide layer has a p-side waveguide layer acceptor concentration less than $3 \times 10^{17}$ cm$^{-3}$ and a p-side waveguide layer thickness less than 100 nm, such that the p-side waveguide layer thickness is less than the n-side waveguide layer thickness. The p-side cladding layer comprises a first thickness portion and a second thickness portion, the first thickness portion being interposed between the second thickness portion and the p-side waveguide layer.

According to one embodiment, the first thickness portion of the p-side cladding layer has a first-portion thickness of 20 nm to 200 nm and a first-portion acceptor concentration less than $3 \times 10^{17}$ cm$^{-3}$. The second thickness portion of the p-side cladding layer has a second-portion acceptor concentration greater than $3 \times 10^{17}$ cm$^{-3}$. Additional embodiments are described.

These and other features, aspects, and advantages of the present invention will become better understood with reference to the following description, appended claims, and accompanying drawings.

BRIEF DESCRIPTION OF THE DRAWINGS

Though the specification concludes with claims particularly pointing out and distinctly claiming the invention, it is believed that the present invention will be better understood from the following description taken in conjunction with the accompanying drawings, in which:

DETAILED DESCRIPTION

Features and advantages of the invention will now be described with occasional reference to specific embodiments. However, the invention may be embodied in different forms and should not be construed as limited to the embodiments set forth herein. Rather, these embodiments are provided so that this disclosure will be thorough and complete and will fully convey the scope of the invention to those skilled in the art.

As used herein, the term "Group III nitride-based" with respect to a device or a device layer means that the device or the device layer is fabricated on a substrate of a Group III element nitride. Group III element nitride materials include, but are not limited to binary gallium nitride, ternary alloys such as aluminum gallium nitride (AlGaN) and indium gallium nitride (InGaN), and quaternary alloys such as aluminum indium gallium nitride (AlInGaN).

Parentheses in formulas representing the various Group III nitrides denote optional elements, whereas elements outside of parentheses are to be regarded as required within a given alloy. For example, the notation (Al)InGaN corresponds to an alloy comprising InGaN, in which aluminum or, more specifically, AlN, is optional. As such, "(Al)InGaN" is equivalent to "InGaN or AlInGaN." Likewise, the notation (Al,In)GaN corresponds to an alloy comprising GaN, in which both aluminum (as AlN) and indium (as InN) are optional as alloy elements. As such "(Al,In)GaN" is equivalent to "GaN, AlGaN, InGaN, or AlInGaN."

When used without further qualification as to composition or stoichiometry, formulas such as AlGaN or AlInGaN are to be understood as encompassing the entire available compositional range, as though the formulas were written in the form $Al_xGa_{1-x}N$ or $Al_xIn_yGa_{1-x-y}N$ respectively, where $0<x<1$ and $0<y<1$, such that $x+y<1$. Similarly, (Al)InGaN is to be understood as equivalent to $Al_xIn_yGa_{1-x-y}N$, where $0 \leq x<1$ and $0<y<1$, such that $x+y<1$. The formula (Al,In)GaN is to be understood as equivalent to $Al_xIn_yGa_{1-x-y}N$, where $0 \leq x<1$ and $0 \leq y<1$, such that $x+y<1$. As will be evident from these compositional ranges, the values attached to the subscripts corresponding to optional elements each include zero as possibilities, whereas the values for required elements each do not include zero as possibilities. Any given layer described according to a generic formula (e.g., AlGaN or (Al,In)GaN) or a range formula (e.g., $Al_xGa_{1-x}N$ or $Al_xIn_yGa_{1-x-y}N$) may be a bulk layer having a specific and essentially uniform composition according to the generic formula or range formula, a superlattice having an average composition according to the generic formula or range formula, a periodic structure having an average composition according to the generic formula or range formula, or a compositionally gradient structure comprising a plurality of zones having an average composition according to the generic formula or range formula.

With particular regard to the Group III elements aluminum, indium, and gallium, any Group III element not included in a formula of a Group III nitride is presumed to be not present at higher than an a natural impurity level in the Group III nitride described by the formula. For example, though it is generally understood that "AlGaN" may be described as an alloy of MN and GaN, recitation of a term such as "a layer of GaN" is to be construed as equivalent to "a layer of $Al_xIn_yGa_{1-x-y}N$, where x=0 and y=0."

With respect to the composition of any layer, terms such as "aluminum concentration," "indium concentration," and the like refer to average compositions of the respective elements within the layer and refer to concentrations with respect to Group III elements only, assuming a 1:1 ratio of total atoms of Group III elements to atoms of nitrogen. Unless stated otherwise, concentrations of a particular Group III element in a layer are given in mol. %, which is to be understood as the number of atoms of the particular Group III element in the layer, divided by the total number of atoms of Group III elements in the layer, multiplied by 100. It will be understood that compositional variations such as nonstoichiometries may occur within the layers without affecting the function of the layers within the device. Consistent with the above definitions, a statement such as "the (Al,In)GaN layer has an aluminum concentration of 10%" is equivalent to a recitation of an empirical molecular formula for the layer such as $Al_{0.10}In_yGa_{0.9-y}N$, where 0≤y<0.9. Expressed in an alternative manner, the statement "the AlGaN layer has an aluminum concentration of 10%" describes an AlGaN alloy layer composed of 10 mol. % AlN and 90 mol % GaN. Recitation of such an empirical molecular formula will be understood also to represent average compositions and to encompass compositional variations inherent to the material recited in the formula.

Except where explicitly stated to the contrary, it will be understood further that each of the nitride alloys may be doped with one or more dopants such as, for example, magnesium (a p-type dopant with respect to Group III nitride semiconductors) or silicon (an n-type dopant with respect to Group III nitride semiconductor). The one or more dopants do not appear in the formulas for the various alloys but are recited separately, such as by reciting that a given alloy is "n-doped" or "p-doped," for example. Unless positively recited as undoped, n-doped, p-doped, or any combination of two of these, each nitride alloy may be undoped, n-doped, or p-doped.

Figure 1A:
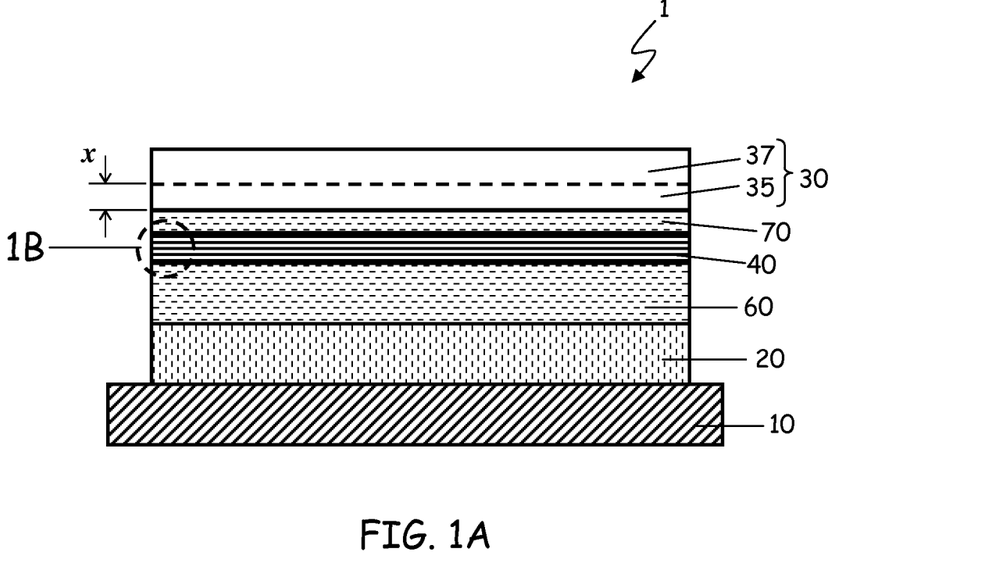
FIG. 1A is a side view of a Group III nitride-based laser diode according to embodiments described herein.

Referring to FIG. 1A, a Group III nitride-based laser diode 1 comprises an n-side cladding layer 20, an n-side waveguide layer 60, an active region 40, a p-side waveguide layer 70, and a p-side cladding layer 30. The active region 40 is interposed between the n-side cladding layer 20 and the p-side cladding layer 30 and extends substantially parallel to the n-side cladding layer 20 and the p-side cladding layer 30. The n-side waveguide layer 60 is interposed between the active region 40 and the n-side cladding layer 20. The p-side waveguide layer 70 is interposed between the active region 40 and the p-side cladding layer 30.

The n-side cladding layer 20 is a layer of n-doped (Al,In)GaN. In example embodiments, the layer of (Al,In)GaN is $Al_xIn_yGa_{1-x-y}N$, where 0≤x<0.2 and 0≤y<0.3. The n-side cladding layer 20 may be any thickness and have any donor concentration suitable to provide adequate conductivity. Generally, the n-side cladding layer 20 may be from 0.5 μm to about 2 μm thick. The carrier concentration of the n-side cladding layer 20 is typically in the range of $10^{17}$ cm$^{-3}$ to $10^{19}$ cm$^{-3}$ of an n-type dopant such as silicon, for example. But in general, because n-type dopants are not sources of optical loss, the carrier concentration is not strictly optimized beyond ensuring adequate conductivity. In some embodiments, it may be preferred that the n-side cladding layer 20 be a layer of n-doped GaN. It is believed that GaN may be advantageous over AlGaN, InGaN, or AlInGaN as a cladding layer in some embodiments. For example, because GaN is a binary alloy, it may be less likely to introduce compositional fluctuations into the layers and also may be more thermally conductive than ternary and quaternary alloys in general. These characteristics of binary alloys generally may reduce optical loss, as compared with ternary and quaternary alloys.

The n-side waveguide layer 60 is a layer of n-doped (Al)InGaN. In example embodiments, the layer of (Al)InGaN is $Al_xIn_yGa_{1-x-y}N$, where 0≤x<0.2 and 0<y<0.3. In some embodiments, it may be preferred that the n-side waveguide layer be a layer of n-doped InGaN. The n-side waveguide layer has an n-side waveguide layer thickness less than 300 nm, less than 200 nm, less than 120 nm, or from 1 nm to 120 nm. In preferred embodiments, the n-side waveguide layer thickness is from 125 nm to 300 nm, from 125 nm to 200 nm, from 125 nm to 150 nm, or from 50 nm to 120 nm. The carrier concentration of the n-side waveguide layer 60 is typically in the range of $10^{17}$ cm$^{-3}$ to $10^{19}$ cm$^{-3}$ of an n-type dopant such as silicon, for example.

The active region 40 comprises one or more InGaN quantum wells that produce electrically-pumped stimulated emission of photons. The active region 40 also produces optical gain at a lasing wavelength in the green portion of the visible electromagnetic spectrum, typically defined as light having a wavelength of from 510 nm to 580 nm. Each InGaN quantum well may be interposed between two AlInGaN quantum well barriers.

Figure 1B:
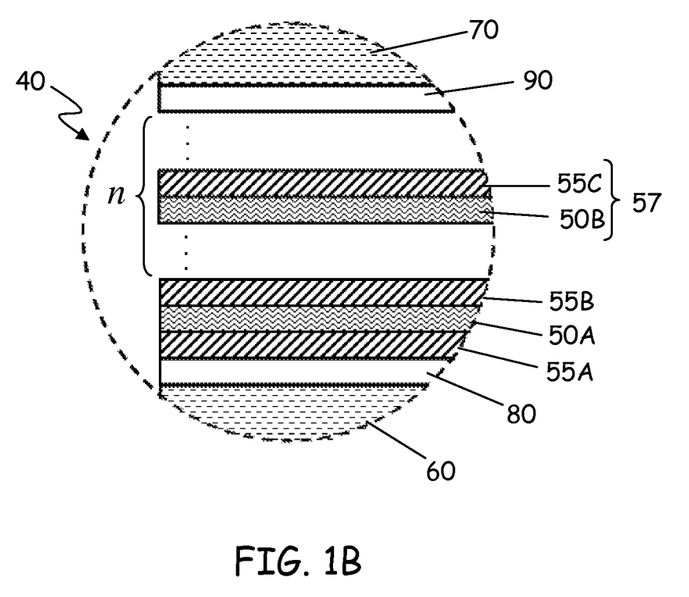
FIG. 1B is an inset view of the active region of the Group III nitride-based laser diode shown in FIG. 1A.

The layer structure of the active region 40 is shown in greater detail in FIG. 1B. The active region 40 in FIG. 1B is shown as an exploded view to illustrate optional repetition of the quantum well layers. It will be understood that all layers of the active region 40 are stacked on each other as a continuous multilayer, but that the continuous multilayer may include additional layers not shown in FIG. 1B interposed between the layers shown in FIG. 1B. The additional layers may comprise spacers, for example, which may be present to optimize the performance of the active region 40 but are not necessary for the active region 40 to function. In general, a quantum well 50A is interposed between a first quantum well barrier 55A and a second quantum well barrier 55B. Each quantum well 50A, 50B is typically from about 1 nm to about 20 nm thick and may be a single layer (as shown) or multiple layers (not shown). Each quantum well 50A, 50B may be one or more layers of InGaN. The InGaN of the quantum wells 50A, 50B may have an indium concentration from 20% to 40%, for example. Similarly, the quantum well barriers 55A, 55B, 55C individually may be single layers (as shown) or multiple layers (not shown). The quantum well barriers 55A, 55B, 55C each may be layers of AlInGaN and may have thicknesses from about 1 nm to about 50 nm, for example. As example specific compositions, the AlInGaN of the quantum well barriers 55A, 55B, 55C may have indium concentrations from about 0% to about 20% and aluminum concentrations from about 0% to about 20%.

The active region 40 may comprise one quantum well or may comprise multiple quantum wells. In FIG. 1B, a repeat unit 57 is shown as an additional quantum well 50B and an additional quantum well barrier layer 55C, such that when the repeat unit 57 is stacked onto an existing quantum well barrier, such as onto the second quantum well barrier 55B, the top barrier layer of a first quantum well (here, second quantum well barrier 55B) becomes also the bottom barrier layer of the additional quantum well 50B. The active region 40 may comprise a number n of the repeat units 57, where n may be zero in a single-well active region or may be an integer from 1 to 20, from 1 to 10, from 1 to 5, or from 1 to 3 for multiple-well active regions.

Referring to FIGS. 1A and 1B, the Group III nitride-based laser diode 1 may further comprise a hole-blocking layer 80, an electron-blocking layer 90, or both. When present, the hole-blocking layer 80 may be interposed between the active region 40 and the n-side waveguide layer 60 and may have a thickness from about 10 nm to about 20 nm. When present, the electron-blocking layer 90 may be interposed between the active region 40 and the p-side waveguide layer 70. In an alternative embodiment not shown, the electron-blocking layer may be interposed between the p-side waveguide layer and the p-side cladding layer.

When present, the electron-blocking layer 90 may be an AlGaN layer, an AlInGaN layer, or a combination of AlGaN and AlInGaN layers, wherein the electron-blocking layer 90 has a thickness from about 5 nm to about 50 nm. Preferably, the electron-blocking layer 90 has a wider bandgap than the layers to which it is adjacent and is heavily doped to an acceptor concentration of at least $10^{18}$ cm$^{-3}$, or from $10^{18}$ cm$^{-3}$ to $10^{21}$ cm$^{-3}$. The acceptor species in the electron-blocking layer 90 may be magnesium, for example. Without intent to be limited by theory, it is believed that the choice of a very thin electron-blocking layer with a bandgap wider than that of the adjacent layers prevents increased internal optical loss arising from the heavy doping of the electron-blocking layer 90. This may be a result of the ability of holes, particularly of holes localized either in potential fluctuations or in the acceptor level, to escape from the electron-blocking layer 90 and to dissipate in the adjacent layers. Moreover, ionized acceptors in the electron-blocking layer 90 may provide an electric field that promotes hole transport and suppresses electron transport. Thus, it is believed that when the electron-blocking layer 90 is highly doped, efficiency of the electron-blocking layer 90 may be increased, hole injection efficiency may be increased, and device series resistance may be reduced without a concomitant increase of internal optical loss.

The p-side waveguide layer 70 is a layer of p-doped (Al)InGaN. In some embodiments, it may be preferred that the p-side waveguide layer 70 be a layer of p-doped InGaN. In example embodiments, the p-side waveguide layer 70 may be a layer of $(Al)In_xGa_{1-x}N$, where x is from 0.04 to 0.15, from 0.06 to 0.11, preferably about 0.10. It may be preferable for the p-side waveguide layer 70 to have the same or nearly the same (for example, within ±0.03 mol. %) indium concentration as that of the n-side waveguide layer 60. Compositional similarity of the p-side waveguide layer 70 and the n-side waveguide layer 60 may optimize strain relaxation in the Group III nitride-based laser diode 1. For example, when strain relaxation is accomplished via formation of misfit defects between the waveguide layers and the respective cladding layers, it may be preferable that the waveguide layers have indium concentrations from about 6% to about 11%, more specifically from about 7% to about 9% to attain optimal optical confinement with diminished concern about degradation of material quality. On the other hand, if the waveguides and cladding layers are not formed with intentional strain relaxation, a lower indium concentration such as from about 3% to about 6% may be desirable. The p-side waveguide layer 70 may have a p-side waveguide layer acceptor concentration less than $3 \times 10^{17}$ cm$^{-3}$, from $1 \times 10^{15}$ cm$^{-3}$ to $3 \times 10^{17}$ cm$^{-3}$, or preferably from $1 \times 10^{16}$ cm$^{-3}$ to $3 \times 10^{17}$ cm$^{-3}$. In general, the p-side waveguide layer acceptor concentration should be sufficiently low to avoid high internal optical losses when the optical mode overlaps the p-side waveguide layer 70. However, the p-side waveguide layer acceptor concentration should be sufficiently high to overcome possible doping compensation and, thereby, to prevent high series resistance or even thyristor behavior.

In further embodiments, the p-side waveguide layer 70 may have an indium concentration lower than that of the n-side waveguide layer 60. In such embodiments, the p-side waveguide layer 70 may have an indium concentration of from about 0% to about 9% or from about 0% to about 7%, and the n-side waveguide layer 60 may have an indium concentration of from about 3% to about 11% or from about 3% to about 9%. Preferably, the indium concentration of the p-side waveguide layer 70 is lower than the indium concentration of the n-side waveguide layer 60. Preferably, if the indium concentrations of the waveguides are expressed as molar percents, the lower indium concentration of the p-side waveguide layer 70, subtracted from the higher indium concentration of the n-side waveguide layer 60, may yield an indium concentration difference of greater than or equal to 2%.

When the p-side waveguide layer 70 has a lower indium concentration than that of the n-side waveguide layer 60, the p-side waveguide layer thickness and the n-side waveguide layer thickness may be approximately equal, but it may be preferable the n-side waveguide layer thickness is greater than the p-side waveguide layer thickness. As a specific example, the n-side waveguide layer thickness may be from 125 nm to 300 nm and the p-side waveguide layer thickness may be less than 100 nm.

In general, the p-side waveguide layer 70 may have a p-side waveguide layer thickness less than 100 nm, less than 50 nm, less than 40 nm, from 1 nm to 50 nm, or from 20 nm to 50 nm. In preferred embodiments, the p-side waveguide layer thickness is less than the n-side waveguide layer thickness. For example, the p-side waveguide layer thickness may be from 1 nm to about 10% of the n-side waveguide layer thickness, from 1 nm to about 20% of the n-side waveguide layer thickness, from 1 nm to about 25% of the n-side waveguide layer thickness, from 1 nm to about 30% of the n-side waveguide layer thickness, from 1 nm to about 35% of the n-side waveguide layer thickness, from 1 nm to about 40% of the n-side waveguide layer thickness, from 1 nm to about 45% of the n-side waveguide layer thickness, from 1 nm to about 50% of the n-side waveguide layer thickness, from 1 nm to about 60% of the n-side waveguide layer thickness, from 1 nm or to about 75% of the n-side waveguide layer thickness. In especially preferred embodiments, the sum of the n-side waveguide layer thickness and the p-side waveguide layer thickness (i.e., the total waveguide thickness) is from about 150 nm to about 200 nm.

It is believed that choice of the relation between the p-side waveguide layer thickness and the n-side waveguide layer thickness, particularly in combination with doping profiles described below in greater detail, strongly contribute to favorable decreases in internal optical losses in the Group III nitride-based laser diode 1. For example, because optical mode decays exponentially with respect to distance from the active region 40, a slight shift of the optical mode away from a heavily p-doped portion of the p-side cladding layer 30 may result in an exponential decrease of overlap of the optical mode with the heavily p-doped portion. Though the overlap of the shifted optical mode with the active region 40 may be slightly less than typically would be present when optical mode is not shifted in this manner, it is believed that the exponential decrease in overlap of the shifted optical mode with heavily p-doped material may significantly reduce overall optical loss.

The optimal total waveguide thickness maximizes optical confinement by obtaining minimal optical mode broadening. When the total waveguide thickness is larger than the optimal total waveguide thickness, the laser diode has a higher amount of optical mode broadening because the optical mode populates the broader waveguide region in the laser diode. But also, when the total waveguide thickness is smaller than the optimal total waveguide thickness, the laser diode has a higher amount of optical mode broadening because a reduced integral refractive index contrast between the waveguide layers and the cladding layers provides less optical confinement. Optical loss from p-type material overlap may be mitigated for a given total waveguide thickness by decreasing the p-side waveguide layer thickness and increasing the n-side waveguide layer thickness. When the p-side waveguide layer thickness is decreased, particularly relative to the n-side waveguide layer thickness, the optical mode occupies a larger amount of n-type material than p-type material. Decreasing the overlap of the optical mode with p-type material, in turn, reduces optical loss. This advantageous reduction of optical loss is more pronounced than any disadvantageous decrease in optical confinement factor that may result from increasing the n-side waveguide layer thickness above optimal levels.

As an illustrative example not intended to be limiting, a first laser diode and a second laser diode may be fabricated according to any of the embodiments described above, wherein both laser diodes are fabricated to have total waveguide thicknesses of 160 nm. The first laser diode may have an n-side waveguide layer thickness of 120 nm and a p-side waveguide layer thickness of 40 nm. The second laser diode may have an n-side waveguide layer thickness of 130 nm and a p-side waveguide layer thickness of 30 nm. Theoretically, the second laser diode will have a lower optical confinement factor than will the first laser diode. Even so, the reduction in optical loss by having less optical-mode overlap with p-type material in the second laser diode than in the first laser diode will be greater than the decrease in optical confinement factor between the first laser diode and the second laser diode. As such, the second laser diode will be expected to have a higher wall plug efficiency than the first laser diode. Thus, it is believed that, for a given total waveguide thickness, the ratio of modal gain to internal loss increases with increasing n-side waveguide layer thickness.

The p-side cladding layer 30 is a layer of p-doped (Al,In) GaN. In example embodiments, the layer of (Al,In)GaN is $Al_xIn_yGa_{1-x-y}N$, where $0 \leq x < 0.2$ and $0 \leq y < 0.3$. The p-side cladding layer 30 comprises a first thickness portion 35 and a second thickness portion 37. The first thickness portion 35 is interposed between the second thickness portion 37 and an interface of the p-side cladding layer 30 with the p-side waveguide layer 70. The first thickness portion 35 of the p-side cladding layer 30 has a first-portion thickness x of less or equal to than 200 nm, specifically from 1 nm to 200 nm, preferably from 20 nm to 200 nm. The total thickness of the p-side cladding layer typically is from about 0.5 μm to about 1.5 μm, for example. The upper limit of total thickness of the p-side cladding layer is not critical, except that an excessively thick p-side cladding layer may undesirably reduce device conductivity.

In one embodiment, the p-side cladding layer 30 is fabricated with a gradient doping profile, such that the first thickness portion 35 has a first-portion acceptor concentration less than $3 \times 10^{17}$ cm$^{-3}$ and the second thickness portion 37 has a second-portion acceptor concentration greater than $3 \times 10^{17}$ cm$^{-3}$. The first-portion acceptor portion acceptor concentration is lower than the second-portion acceptor concentration in part to decrease exposure of the optical mode to acceptors in the p-side cladding layer 30. Under normal operating conditions of the Group III nitride-based laser diode 1, the optical mode may be expected to extend slightly into the p-side cladding layer 30. Exposure of the optical mode to the acceptors typically results in optical loss. Because the optical mode does not typically extend significantly through the entirety of the p-side cladding layer 30, it is unnecessary to decrease the acceptor concentration for the entirety of the p-side cladding layer 30.

The gradient doping profile of the p-side cladding layer 30 may result in, but need not result in, an abrupt change in acceptor concentrations so as to define a sharp interface between the first thickness portion 35 and the second thickness portion 37. For example, the acceptor concentration may increase gradually through the entire thickness of the p-side cladding layer from bottom to top, such that the first thickness portion 35 ends, and the second thickness portion begins, when the acceptor concentration reaches or exceeds $3 \times 10^{17}$ cm$^{-3}$. Though the second thickness portion 37 at its boundary with the first thickness portion 35 may have an acceptor concentration of about $3 \times 10^{17}$ cm$^{-3}$, the gradient doping profile may continue to increase through the thickness of the second thickness portion 37. Portions of the second thickness portion 37 may have acceptor concentrations in excess of $1 \times 10^{18}$ cm$^{-3}$, in excess of $1 \times 10^{19}$ cm$^{-3}$, or from about $3 \times 10^{17}$ cm$^{-3}$ to about $1 \times 10^{20}$ cm$^{-3}$.

With regard top-type doping profiles of the p-side waveguide layer 70 and the p-side cladding layer 30 generally, it is believed that optical loss may be attributable to a prevalence of localized holes that are trapped in valence-band potential fluctuations or on acceptors. Whereas activated holes contribute to conductivity in a layer, localized holes do not. Thus, when localized holes are likely to be present, the layer must be more heavily doped to compensate for the decrease in conductivity. It is believed that the prevalence of localized holes may be mitigated by choosing a dopant species having an activation energy of less than or equal to about 170 meV or, alternatively, choosing materials for device layers, wherein a given species such as magnesium has an activation energy of less than or equal to about 170 meV. Selection of the activation energy in this manner may increase conductivity while maintaining a constant level of optical loss. In all respects, because overlap of the optical mode with p-doped material has been found to cause increased optical loss with increased acceptor concentration, the p-type doping profiles in p-doped layers preferably maintain a minimum acceptor concentration in the proximity of the active region (where optical mode is most intense), in the p-side waveguide layer 70, and the first thickness portion 35 of the p-side cladding layer 30.

Figure 2:
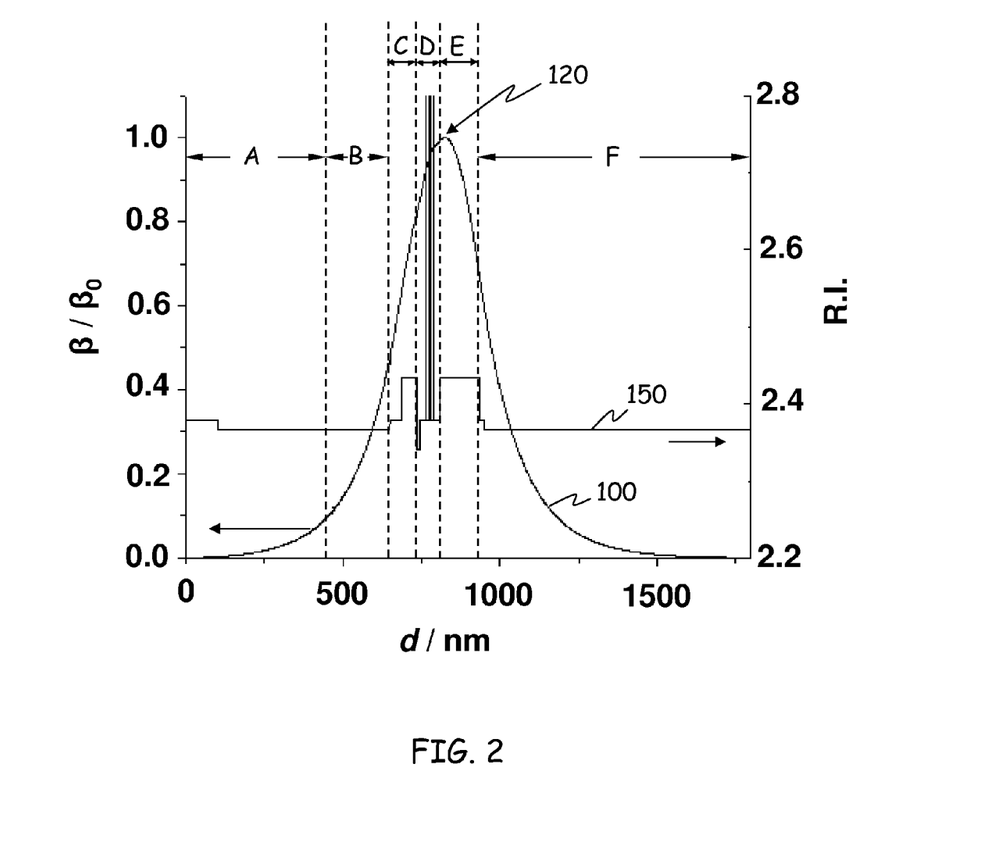
FIG. 2 is a graph superimposing simulated optical mode intensity and refractive index of layers as a function of depth from the top to the bottom of an example Group III nitride-based laser diode according to an embodiment described herein.

To illustrate several operative principles of GaN-based laser diodes according to embodiments described above, a simulated optical mode intensity of an example GaN-based laser diode is provided as a graph in FIG. 2. In FIG. 2, the optical mode curve 100 plots normalized optical-mode density $\beta/\beta_0$ against a depth coordinate d (in nm), whereby 0 nm corresponds to the top of the laser diode and $\beta_0$ is the maximum optical-mode density over the entire depth profile. The refractive index line 150 plots refractive index (R.I.) against the same depth coordinate d. Dashed vertical lines illustrate the depth positions of the functional layers of the GaN-based laser diode. The letters A through F each label regions of the depth profile that correspond to functional layers, wherein: A is the second thickness portion p-side cladding layer (highly-doped); B is the first thickness portion of the p-side cladding layer (lightly-doped); C is the p-side waveguide layer; D is the active region; E is the n-side waveguide layer; and F is the n-side cladding layer. Both waveguide layers (C and E) have higher indices of refraction than the cladding layers (A, B, and F). The active region (D) has a high refractive index. The n-side waveguide layer (E) is thicker than the p-side waveguide layer (C) and, as such, the peak 120 of the optical mode curve 100 is centered over the n-side waveguide layer (E). A boundary between the first thickness portion (B) of the p-side cladding layer and the second thickness portion (A) of the p-side cladding layer is located at the depth of about 475 nm. At the position of this boundary, the optical mode intensity is about 10% of the optical mode intensity at the peak 120, compared to slightly over 40% at the boundary between the first thickness portion (B) and the p-side waveguide layer (C). Because the first thickness portion (B) is lightly doped, the portion of optical mode in the first thickness portion (B) is less susceptible to optical loss through overlap with acceptors in the p-side cladding layer.

Referring back to FIG. 1A, in some embodiments, it may be preferred that the p-side cladding layer 30 be a layer of p-doped GaN and, optionally, that the n-side cladding layer 20 be a layer of n-doped GaN. Without intent to be limited by theory, it is believed that a lower optical absorption coefficient in GaN material relative to that of AlGaN reduces output optical losses, even though optical confinement factor also may be reduced. For example, though a laser diode with GaN claddings may have an optical confinement factor as low as 67% of that of a laser diode with AlGaN cladding layers, the same GaN claddings may result in a laser diode having 50% of the optical loss exhibited by the laser diode with AlGaN claddings. Because in such a device the decrease in optical loss exceeds the decrease in optical confinement factor, the GaN cladding layers may result in increased wall plug efficiency over the AlGaN. Additionally, p-doped GaN has a lower magnesium-acceptor activation energy than AlGaN. It is believed that decreased acceptor activation energy in the p-side cladding layer 30 may decrease optical loss, because when activation energy is decreased the acceptor concentration required to obtain a predetermined conductivity also is decreased.

In another embodiment, the p-side cladding layer 30 is a layer of (Al,In)GaN having a compositional gradient of aluminum. In the compositional gradient, aluminum concentration in the p-side cladding layer 30 may be increased with increasing distance from the active region. The compositional gradient may define two or more zones within the p-side cladding layer 30. For example, an aluminum concentration of from 0% to 5% may define a first zone of the p-side cladding layer 30 nearest the active region 40. The first zone may extend from an interface with the p-side waveguide layer 70 and include the first about 20 nm to about 200 nm of the thickness of the p-side cladding layer 30 above the p-side waveguide layer 70. An increased aluminum concentration of up to 20%, or from 5% to 20%, may define a second zone of the p-side cladding layer 30 immediately above the first zone. The aluminum concentrations in the first and second zones need not be uniform. Preferably, aluminum concentration increases through the thickness of the p-side cladding layer 30 with increasing distance from the p-side waveguide layer 70. The total thickness of the first zone and the second zone may be from about 200 nm to about 500 nm. A third zone of the p-side cladding layer 30 immediately above the second zone may have any aluminum concentration or even may be devoid of aluminum. The designation of zones of the p-side waveguide layer 70 with regard to describing the aluminum compositional gradient may be, but need not be, correlated to the first thickness portion 35 and the second thickness portion 37, both of which together define an acceptor concentration gradient, as described above.

It is believed that the aluminum compositional gradient having a low level of aluminum nearest the p-side waveguide layer 70 and the active region 40 provides a decreased acceptor activation energy that may increase conductivity for a given acceptor concentration when aluminum concentration is low or, for example, less than about 5%. Thus, a lower acceptor concentration may be present to maintain a given conductivity. The lower acceptor concentration may reduce optical loss. Thus, with an aluminum compositional gradient present in the p-side cladding layer, with respect to dopant profile, the first thickness portion 35, defined as above, preferably has a first-portion acceptor concentration less than a second-portion acceptor concentration of the second thickness portion 37. In one specific example, the first-portion acceptor concentration may be from $3 \times 10^{17}$ cm$^{-3}$ to $3 \times 10^{18}$ cm$^{-3}$, and the second-portion acceptor concentration may be greater than $3 \times 10^{18}$ cm$^{-3}$. When an aluminum compositional gradient is present in the p-side cladding layer 30, it may be preferred that both the p-side waveguide layer 70 and the n-side waveguide layer 60 be InGaN layers, substantially devoid of aluminum or, alternatively, (Al)InGaN layers having an aluminum concentration of less than 5%, less than 1%, or less than 0.1%.

In still another embodiment, the GaN-based laser diode may further comprise passive quantum well structures or passive multiple quantum well structures. Passive quantum well structures can be configured to promote a high refractive index of the passive quantum well at the lasing wavelength. In particular, the passive quantum wells can be configured such that the absorption edge wavelength of the structure is shorter than the lasing wavelength but the spectral spacing between the lasing wavelength and passive quantum well absorption edge is small. When the absorption edge wavelength of the structure is shorter than the lasing wavelength, the passive quantum well does not absorb lasing light.

In still another embodiment, the Group III nitride-based laser diode 1 may be asymmetric, such that the n-side waveguide layer 60 contains indium but the p-side waveguide layer 70 and the p-side cladding layer 30 do not. For example, the n-side waveguide layer 60 may either be formed from bulk InGaN or be configured as a InGaN superlattice or passive InGaN multiple-quantum well structure. In some embodiments, when the Group III nitride-based laser diode 1 is asymmetric, a p-side waveguide layer 70 separate from a p-side cladding layer 30 is unnecessary and, as such the p-side waveguide layer 70 may be regarded as having a thickness of zero. The passive multiple-quantum well structure may be configured to have its absorption edge spectral position close to the lasing wavelength, so as to increase optical confinement within the n-side waveguide layer 60. Although the optical mode in an asymmetric laser diode is shifted to the n-side of the device, the optical confinement factor is not strongly reduced. It is believed that the asymmetric structure may afford better control of p-type conductivity, particularly when p-doped GaN layers are used as the p-side cladding layer 30 as a substitute for having a p-doped InGaN layer as a p-side waveguide layer, along with a separate p-side cladding layer.

In still another embodiment, the p-side waveguide layer 70, the n-side waveguide layer 60, or both, may be compositionally graded (Al)InGaN layers of the appropriate conductivity type, each having a gradient indium concentration such that indium concentration of the waveguide layer or layers is higher in an indium-rich zone adjacent to the active region 40 than in the remainder of the respective waveguide layer or layers. For this approach, it may be preferable to have no strain relaxation in the structure. Without intent to be limited by theory, it is believed that a super-linear dependence of refractive index as a function of indium concentration may improve optical confinement when an increased indium concentration is present one or both of the waveguide layers. In particular, it may be preferable to establish an increased indium concentration in a high-indium zone in one or both of the waveguide layers adjacent to the active region to increase optical mode localization around the active region 40. As a consequence of this increased optical mode localization, the optical confinement factor of the active region 40 may be increased. In a given waveguide layer having a graded indium concentration, the indium-rich zone may be defined, for example, as a portion of the waveguide layer adjacent to the active region 40 and having a thickness from about 0.1% to about 75%, from about 0.1% to about 50%, from about 0.1% to about 25%, from about 0.1% to about 10%, from about 1% to about 25%, from about 10% to about 25%, or from about 20% to about 50% of the total thickness of the respective waveguide layer.

When the waveguide layers have graded indium concentrations, the indium concentration in the indium-rich zone of one or both waveguide layers may be from about 5% to about 50%, from about 5% to about 40%, from about 5% to about 30%, or from about 10% to about 30%. The indium concentration in the remainder of the respective waveguide layers may be from about 0% to about 10% or from about 0% to about 5%, such that the indium concentration in the indium-rich zone is higher than the indium concentration in the remainder of the respective waveguide layer. The indium concentration difference between the indium-rich zone and the remainder of the respective waveguide layer preferably is at least 1%, at least 2%, at least 3%, at least 5%, or at least 10%. If both the p-side waveguide layer 70 and the n-side waveguide layer 60 have graded indium concentrations, it may be preferable that the indium-rich zones in both waveguide layers have approximately the same indium concentration, such as with an indium concentration difference of ±3%, ±2%, ±1%, or even ±0.1% between the two waveguide layers.

It also may be preferred that one or both of the waveguide layers have graded indium concentrations and that the p-side waveguide layer thickness be less than the n-side waveguide layer thickness. It is believed that a smaller p-side waveguide layer thickness compared to the n-side waveguide layer thickness may reduce optical mode penetration to the p-side of the Group III nitride-based laser diode 1 and, thereby, may reduce the internal optical loss.

In the context of these graded indium concentrations, it will be understood that the waveguide layers may be formed as superlattices or other periodic structures comprising a plurality of (Al)InGaN layers. Thus, the specific example indium concentrations referenced with respect to the graded indium concentrations will be understood as average indium concentrations over the entire volume of the respective layers. For example, if a waveguide layer is formed as an InGaN/AlInGaN superlattice having relatively thick InGaN layers and relatively thin AlInGaN layers, the average indium concentration of the superlattice will be closer to the average indium concentration of the InGaN layers than to the average indium concentration of the AlInGaN layers. Similarly, even if both the InGaN layers and the AlInGaN layers in the superlattice have the same thickness but the average indium concentration in the InGaN layers is higher than in the AlInGaN layers, the average indium concentration of the superlattice will be the average of the indium concentration of the InGaN layers collectively and the indium concentration of the AlInGaN layers collectively.

In general, the Group III nitride-based laser diode 1 may be formed over a substrate 10 such that the active region, the waveguide layers, and the cladding layers form a multilayered laser diode. In such a multilayered diode, the waveguide layers guide the stimulated emission of photons generated in the active region and the cladding layers promote propagation of the emitted photons through the waveguide layers. The substrate 10 may have an n-type conductivity or a p-type conductivity. The cladding layer having the same conductivity type as the substrate 10 is disposed closer to the substrate than the cladding layer having the conductivity type opposite that of the substrate 10. In the embodiments described herein, it is preferred that the substrate 10 be an n-type semiconductor material, that the n-side cladding layer 20 be interposed between the n-side waveguide layer 60 and the substrate 10, and that the p-side cladding layer 30 be disposed above the n-side cladding layer 20. Examples of materials suitable as substrate 10 include, but are not limited to, free-standing Group III nitride materials such as GaN, AlN, InN, AlGaN, $Ga_{1-n}N$, or AlInGaN. In preferred embodiments, the substrate may be free-standing GaN. In especially preferred embodiments, the substrate may be free-standing GaN having a semipolar orientation such as, for example, an orientation selected from $20\bar{2}1$, $20\bar{2}3$, $20\bar{2}\bar{3}$, $30\bar{3}1$, or $30\bar{3}\bar{1}$. Though an n-type substrate is preferred, it is fully contemplated in an embodiment not shown that a p-type substrate may be used, such that the p-side cladding layer 30 would be interposed between the p-side waveguide layer 70 and the substrate 10 and such that the n-side cladding layer 20 would be disposed above the p-side cladding layer 30.

The Group III nitride-based laser diode 1 may further comprise additional layers or spacers (not shown) between any two of the layers depicted in FIG. 1A. As non-limiting examples, one or more GaN spacers (not shown) may be interposed between the p-side waveguide layer 70 and the p-side cladding layer 30, or between the n-side waveguide layer 60 and the n-side cladding layer 20. The Group III nitride-based laser diode 1 may further comprise contact layers (not shown) and/or interconnections (not shown) for establishing electrical continuity between the n-side cladding layer 20 and the p-side cladding layer 30 through a power source (not shown) configured to introduce electrons into the n-side cladding layer 20. For example, a first contact layer may be formed on a back side of the substrate 10 opposite the n-side cladding layer 20, and a second contact layer may be formed on the p-side cladding layer 30. Alternatively, the first contact layer may be formed on a portion of the substrate not covered by the n-side cladding layer 20.

The layers of the Group III nitride-based laser diode 1 may be sequentially deposited, for example by any deposition technique known in the art or to be developed. As a non-limiting example techniques such as metalorganic chemical vapor deposition (MOCVD), metalorganic vapor phase epitaxy (MOVPE), and the like may be used. Metalorganic deposition processes may include precursors such as trimethyl gallium, trimethyl aluminum (TMA), trimethyl indium, and other compounds known in the art. The layers may be superlattices with short periods. The total thickness of the Group III nitride-based laser diode 1, accounting for all of the above-described layers and optional spacers, typically may range from about 1 µm to about 4 µm.

Green-light emitting Group III nitride-based laser diodes according to any of the embodiments described above may have optical loss levels of less than 8 cm$^{-1}$ when the laser diode comprises AlGaN cladding layers. Optical loss levels of less than 5 cm$^{-1}$ may be obtained for laser diodes comprising GaN cladding layers.

It is noted that recitations herein of a component of the present disclosure being "configured" to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

As a matter of convenience only, device layers are referred to herein by terms such as "top" and "bottom." Within the scope of any one embodiment, these terms are used to denote ordering of the device layers relative to a structure in which the substrate is regarded as the bottom of the device. Beyond this, the terms "top" and "bottom" are not intended to indicate any preferred orientation of the device during operation or fabrication. Accordingly, the term "above" means toward the structure top and the term "below" means toward the structure bottom.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

Unless otherwise defined, all technical and scientific terms used herein have the same meaning as commonly understood by one of ordinary skill in the art to which the invention belongs. The terminology used in the description herein is for describing particular embodiments only and is not intended to be limiting. As used in the specification and appended claims, the singular forms "a," "an," and "the" are intended to include the plural forms as well, unless the context clearly indicates otherwise.

Unless otherwise indicated, all numbers expressing quantities of ingredients, properties such as molecular weight, reaction conditions, and so forth as used in the specification and claims are to be understood as being modified in all instances by the term "about." Accordingly, unless otherwise indicated, the numerical properties set forth in the specification and claims are approximations that may vary depending on the desired properties sought to be obtained in embodiments of the present invention. Notwithstanding that the numerical ranges and parameters setting forth the broad scope of the invention are approximations, the numerical values set forth in the specific examples are reported as precisely as possible. One of ordinary skill in the art will understand that any numerical values inherently contain certain errors attributable to the measurement techniques used to ascertain the values.

What is claimed is:

1. A Group III nitride-based laser diode comprising a substrate of GaN with a semipolar orientation, an n-side cladding layer formed of n-doped (Al,In)GaN, an n-side waveguide layer formed of n-doped (Al)InGaN, an active region, a p-side waveguide layer formed of p-doped (Al)InGaN, and a p-side cladding layer formed of p-doped (Al,In)GaN, wherein:

the active region is interposed between the n-side cladding layer and the p-side cladding layer and extends substantially parallel to the n-side cladding layer and the p-side cladding layer;

the active region comprises one or more InGaN quantum wells producing electrically-pumped stimulated emission of photons and having optical gain at a lasing wavelength from 510 nm to 580 nm;

the n-side waveguide layer is interposed between the active region and the n-side cladding layer;

the n-side waveguide layer has an n-side waveguide layer thickness from 125 nm to 200 nm;

the p-side waveguide layer is interposed between the active region and the p-side cladding layer;

the p-side waveguide layer has a p-side waveguide layer acceptor concentration less than $3 \times 10^{17}$ cm$^{-3}$;

the p-side waveguide layer thickness is from 1 nm to 20% of the n-side waveguide layer thickness;

the p-side cladding layer has a p-side cladding layer total thickness of from about 0.5 µm to about 1.5 µm;

the p-side cladding layer comprises a first thickness portion and a second thickness portion, the first thickness portion being interposed between the second thickness portion and the p-side waveguide layer;

the first thickness portion of the p-side cladding layer has a first-portion thickness of 20 nm to 200 nm and a first-portion acceptor concentration less than $3 \times 10^{17}$ cm$^{-3}$; and the second thickness portion of the p-side cladding layer has a second-portion acceptor concentration greater than $3 \times 10^{17}$ cm$^{-3}$.

2. The Group III nitride-based laser diode of claim 1, wherein the p-side waveguide layer thickness and the n-side waveguide layer thickness define a total waveguide thickness from 150 nm to 200 nm.

3. The Group III nitride-based laser diode of claim 1, wherein the p-side waveguide layer thickness is from 1 nm to 10% of the n-side waveguide layer thickness and the p-side waveguide layer thickness and the n-side waveguide layer thickness define a total waveguide thickness from 150 nm to 200 nm.

4. The Group III nitride-based laser diode of claim 1, wherein:

the p-side waveguide layer, the n-side waveguide layer, or both, are compositionally graded (Al)InGaN layers each having a gradient indium concentration;

each gradient indium composition defines an indium-rich zone adjacent to the active region in the respective waveguide layer;

each indium-rich zone has a thickness of from 0.1% to 75% of the respective waveguide layer thickness;

the indium-rich zone has an average indium concentration from 5% to 50%;

the remainder of the respective waveguide layer outside the indium-rich zone has an average indium concentration of from 0% to 10%;

the average indium concentration of the indium-rich zone is higher than the average indium concentration of the remainder of the respective waveguide; and the indium concentration difference of the indium-rich zone and the remainder of the respective waveguide is at least 3%.

5. The Group III nitride-based laser diode of claim 1, wherein the substrate has n-type conductivity and the n-side cladding layer is interposed between the substrate and the n-side waveguide layer.

6. The Group III nitride-based laser diode of claim 1, wherein each InGaN quantum well is interposed between a two AlInGaN quantum well barriers.

7. The Group III nitride-based laser diode of claim 1, wherein the p-side waveguide layer acceptor concentration is from $1\times10^{16}$ cm$^{-3}$ to $1\times10^{17}$ cm$^{-3}$.

8. The Group III nitride-based laser diode of claim 1, wherein the p-side waveguide layer and the n-side waveguide layer both are $In_xGa_{1-x}N$ layers, where x is from 0.04 to 0.15.

9. The Group III nitride-based laser diode of claim 1, wherein the p-side waveguide layer and the n-side waveguide layer both are $In_xGa_1N$ layers, where x is from 0.06 to 0.11.

10. The Group III nitride-based laser diode of claim 9, wherein x in the p-side waveguide layer is less than x in the n-side waveguide layer.

11. The Group III nitride-based laser diode of claim 9, wherein x in the p-side waveguide layer and x in the n-side waveguide layer differ by not more than 0.03.

12. The Group III nitride-based laser diode of claim 1, further comprising an AlGaN electron blocking layer interposed between the active region and the p-side waveguide layer, the electron blocking layer having an electron blocking layer acceptor concentration of at least $10^{18}$ cm$^{-3}$.

13. The Group III nitride-based laser diode of claim 1, wherein the p-side cladding layer is a layer of GaN.

14. The Group III nitride-based laser diode of claim 1, wherein the n-side cladding layer is a layer of GaN.

15. The Group III nitride-based laser diode of claim 1, wherein the p-side cladding layer and the n-side cladding layer both are layers of GaN.

16. The Group III nitride-based laser diode of claim 1, wherein the n-side waveguide layer is a passive multiple quantum well structure comprising a plurality of InGaN passive quantum well core layers interposed between (Al,In)GaN passive quantum well barrier layers, such that each individual passive quantum well of the passive multiple quantum structure is configured to have an interband transmission peak wavelength less than the lasing wavelength.

17. The Group III nitride-based laser diode of claim 16, wherein the inter-band transmission wavelength of one or more of the individual passive quantum wells is less than 510 nm.

18. The Group III nitride-based laser diode of claim 1, wherein the semipolar orientation is $20\bar{2}1$.

19. The Group III nitride-based laser diode of claim 1, wherein the p-side cladding layer has a compositional gradient of aluminum, such that aluminum concentration in the p-side cladding layer increases with increasing distance from the active region.

20. A Group III nitride-based laser diode comprising an n-side cladding layer formed of n-doped (Al,In)GaN, an n-side waveguide layer formed of n-doped (Al)InGaN, an active region, a p-side waveguide layer formed of p-doped (Al)InGaN, and a p-side cladding layer formed of p-doped (Al,In)GaN, wherein:
the active region is interposed between the n-side cladding layer and the p-side cladding layer and extends substantially parallel to the n-side cladding layer and the p-side cladding layer;
the active region comprises one or more InGaN quantum wells producing electrically-pumped stimulated emission of photons and having optical gain at a lasing wavelength from 510 nm to 580 nm;
the n-side waveguide layer is interposed between the active region and the n-side cladding layer;
the n-side waveguide layer has an n-side waveguide layer thickness from 125 nm to 200 nm;
the p-side waveguide layer is interposed between the active region and the p-side cladding layer;
the p-side waveguide layer has a p-side waveguide layer acceptor concentration less than $3 \times 10^{17}$ cm$^{-3}$ and a p-side waveguide layer thickness from 1 nm to 20% of the n-side waveguide layer thickness;
the p-side cladding layer has a p-side cladding layer total thickness of from about 0.5 μm to about 1.5μm;
the p-side cladding layer comprises a first thickness portion and a second thickness portion, the first thickness portion being interposed between the second thickness portion and the p-side waveguide layer;
the first thickness portion of the p-side cladding layer has a first-portion thickness of 20 nm to 200 nm and a first-portion acceptor concentration less than $3\times10^{17}$ cm$^{-3}$; and
the second thickness portion of the p-side cladding layer has a second-portion acceptor concentration greater than $3 \times 10^{17}$ cm$^{-3}$;
the p-side cladding layer has a compositional gradient of aluminum;
a first aluminum concentration of from 0% to 5% defines a first zone of the p-side cladding layer;
a second aluminum concentration of from 5% to 20% defines a second zone of the p-side cladding layer;
aluminum concentration increases through the thickness of the p-side cladding layer with increasing distance from the p-side waveguide layer;
the first zone extends from an interface of the p-side cladding layer with the p-side waveguide layer and has a thickness of about 20 nm to about 200 nm; and
the second zone is disposed immediately adjacent the first zone opposite the p-side waveguide layer.

21. The Group III nitride-based laser diode of claim 20, wherein the p-side waveguide layer is formed of p-doped InGaN and the n-side waveguide layer is formed of n-doped InGaN.

22. A Group III nitride-based laser diode comprising an n-side cladding layer formed of n-doped (Al,In)GaN, an n-side waveguide layer formed of n-doped (Al)InGaN, an active region, a p-side waveguide layer formed of p-doped (Al)InGaN, and a p-side cladding layer formed of p-doped (Al,In)GaN, wherein:
the active region is interposed between the n-side cladding layer and the p-side cladding layer and extends substantially parallel to the n-side cladding layer and the p-side cladding layer;
the active region comprises one or more InGaN quantum wells producing electrically-pumped stimulated emission of photons and having optical gain at a lasing wavelength from 510 nm to 580 nm;
the n-side waveguide layer is interposed between the active region and the n-side cladding layer;
the n-side waveguide layer has an n-side waveguide layer indium concentration from about 3% to about 11%;
the p-side waveguide layer is interposed between the active region and the p-side cladding layer;

the p-side waveguide layer has a p-side waveguide layer acceptor concentration less than $3 \times 10^{17}$ cm$^{-3}$ and a p-side waveguide layer indium concentration from about 0% to about 9%;

the p-side waveguide layer has a p-side waveguide layer thickness of from 1 nm to 20% of an n-side waveguide layer thickness of the n-side waveguide layer;

the p-side waveguide layer indium concentration is less than the n-side waveguide layer indium concentration;

the p-side waveguide layer, the n-side waveguide layer, or both, are compositionally graded (Al)InGaN layers each having a gradient indium concentration;

each gradient indium composition defines an indium-rich zone adjacent to the active region in the respective waveguide layer;

each indium-rich zone has a thickness of from 0.1% to 75% of the respective waveguide layer thickness;

the indium-rich zone has an average indium concentration from 5% to 50%;

the remainder of the respective waveguide layer outside the indium-rich zone has an average indium concentration of from 0% to 10%;

the average indium concentration of the indium-rich zone is higher than the average indium concentration of the remainder of the respective waveguide; and the indium concentration difference of the indium-rich zone and the remainder of the respective waveguide is at least 3%;

the p-side cladding layer has a p-side cladding layer total thickness of from about 0.5 μm to about 1.5 μm;

the p-side cladding layer comprises a first thickness portion and a second thickness portion, the first thickness portion being interposed between the second thickness portion and the p-side waveguide layer;

the first thickness portion of the p-side cladding layer has a first-portion thickness of 20 nm to 200 nm and a first-portion acceptor concentration less than $3 \times 10^{17}$ cm$^{-3}$; and the second thickness portion of the p-side cladding layer has a second-portion acceptor concentration greater than $3 \times 10^{17}$ cm$^{-3}$.

23. The Group III nitride-based laser diode of claim 22, wherein the p-side waveguide layer and the n-side waveguide layer have an indium concentration difference of greater than or equal to 2%.

24. The Group III nitride-based laser diode of claim 22, wherein the n-side waveguide layer thickness is from 25 mn to 300 nm.

* * * * *